(12) United States Patent
Dakshina-Murthy et al.

(10) Patent No.: US 7,105,399 B1
(45) Date of Patent: Sep. 12, 2006

(54) SELECTIVE EPITAXIAL GROWTH FOR TUNABLE CHANNEL THICKNESS

(75) Inventors: Srikanteswara Dakshina-Murthy, Wappinger Falls, NY (US); Douglas Bonser, Hopewell Junction, NY (US); Hans Van Meer, Fishkill, NY (US); David Brown, Pleasant Valley, NY (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 11/004,951

(22) Filed: Dec. 7, 2004

(51) Int. Cl.
*H01L 21/302* (2006.01)
*H01L 21/8238* (2006.01)

(52) U.S. Cl. ...................... 438/221; 438/692

(58) Field of Classification Search ............ None
See application file for complete search history.

(56) References Cited

U.S. PATENT DOCUMENTS 6,617,226 B1 * 9/2003 Suguro et al. ............ 438/481
2003/0068860 A1 * 4/2003 Rabkin et al. ............ 438/257

* cited by examiner

*Primary Examiner*—Ha Tran Nguyen

(57) ABSTRACT

Gate electrodes with selectively tuned channel thicknesses are formed by selective epitaxial growth. Embodiments include forming shallow trench isolation regions in an SOI substrate, selectively removing the nitride stop layer and pad oxide layer in an exposed particular active region, and implementing selective epitaxial growth to increase the thickness of the semiconductor layer in the particular active region. Subsequently, the remaining nitride stop and pad oxide layers in other active regions are removed, gate dielectric layers formed, as by thermal oxidation, and the transistors completed.

19 Claims, 10 Drawing Sheets

SELECTIVE EPITAXIAL GROWTH FOR TUNABLE CHANNEL THICKNESS

FIELD OF THE INVENTION

The present invention relates to the fabrication of microminiaturized semiconductor devices having increased operating speed. The present invention is particularly applicable in fabricating semiconductor devices comprising different types of transistors with tunable channel thicknesses.

BACKGROUND OF THE INVENTION

The relentless pursuit of miniaturized semiconductor devices continues to challenge the limitations of conventional semiconductor materials and fabrication techniques. Conventional semiconductor devices typically comprise a plurality of active devices in or on a common semiconductor substrate, e.g., CMOS devices comprising at least a pair of PMOS and NMOS transistors in spaced adjacency. Current technology utilizes crystalline semiconductor wafers as substrates, such as a lightly p-doped epitaxial ("epi") layer of silicon (Si) grown on a heavily-doped, crystalline Si Substrate. The low resistance of the heavily-doped substrate is necessary for minimizing susceptibility to latch-up, whereas the light doping of the epi layer permits independent tailoring of the doping profiles of both the p-type and n-type wells formed therein as part of the fabrication sequence, thereby resulting in optimal PMOS and NMOS transistor performance.

The use of the very thin epi layers, i.e., several μm thick, is made possible by utilizing shallow trench isolation ("STI"), which advantageously minimizes up-diffusion of p-type dopant(s) from the more heavily-doped substrate into the lightly-doped epi layer. In addition, STI allows for closer spacing of adjacent active areas by avoiding the "bird's beak" formed at the edge of each LOCOS isolation structure. STI also provides better isolation by creating a more abrupt structure, reduces the vertical step from active area to isolation to improve gate lithography control, eliminates the high temperature field oxidation step that can cause problems with large diameter, i.e., 8 inch, wafers, and is scalable to future logic technology generations.

Conventional practices include forming a semiconductor layer, such as silicon (Si) or silicon-germanium (Si—Ge), on an insulating substrate, or over an insulation layer formed on a substrate. Such technology sometimes is referred to as Silicon-on-Insulator (SOI) technology. Silicon-on-Insulator metal oxide silicon (MOS) technologies have a number of advantages over bulk silicon MOS transistors. These advantages include: reduced source/drain capacitance and hence improved speed performance at higher-operating frequencies; reduced $N^+$ to $P^+$ spacing and hence higher packing density due to ease of isolation; and higher "soft error" upset immunity (i.e., the immunity to the effects of alpha particle strikes).

Silicon-on-Insulator technology is characterized by the formation of a thin silicon layer for formation of the active devices over an insulating layer, such as an oxide, which is in turn formed over a substrate. Transistor sources and drains are formed by, for example, implantations into the silicon layer while transistor gates are formed by forming a patterned oxide and conductor (e.g., metal) layer structure. Such structures provide a significant gain in performance by having lower parasitic capacitance (due to the insulator layer) and increased drain current due to floating body charging effects (since no connection is made to the channel region and charging of the floating body provides access towards a majority of carriers which dynamically lower the threshold voltage, resulting in increased drain current). However, the floating body can introduce dynamic instabilities in the operation of such a transistor.

Conventional SOI field effect transistor's (FET's) have floating bodies in which the body or channel region of the FET is located on an insulator and not electrically connected to a fixed potential. These devices are known as partially depleted SOI devices and have the aforementioned advantages and disadvantages. Fully depleted SOI devices are those in which the layer of semiconductor is sufficiently thin, such that the entire thickness of the body regions is depleted of majority carriers when in the off state and both diffusions are at ground. Fully depleted devices offer additional advantages, such as reduced short channel effect, increased transconductance and reduced threshold voltage sensitivity to changes in body doping. Furthermore, the kink effects and threshold voltage shifts caused by body charging in partially depleted devices are reduced. The fully depleted devices do not have a neutral region in the channel and thus do not allow for charging and discharging of the body corresponding to the change in threshold voltage. Additionally, the fully depleted devices do not show hysterisis effect.

Semiconductor devices typically contain various different types of transistors, e.g., N-channel MOS, P-channel MOS, low Vt and high Vt transistors, as well as wide and narrow transistors. In order to optimize the operating speed of an integrated circuit it would be advantageous to provide efficient methodology enabling the fabrication of various types of transistors having a tunable channel thickness which can be precisely controlled or tailored for a particular implementation. It would also be advantageous to provide methodology enabling the fabrication of a semiconductor device based on an SOI substrate with both partially depleted and fully depleted transistors, consistent with the desired characteristics of the particular device for a particular implementation.

Accordingly, a need exists for efficient methodology enabling the fabrication of various types of semiconductor devices comprising transistors having tunable channel thicknesses. There exists a particular need for methodology enabling the fabrication of semiconductor devices based on SOI substrates with both partially depleted and fully depleted transistors, depending upon the desired characteristics of the device for a particular implementation.

DISCLOSURE OF THE INVENTION

An advantage of the present invention is a method of fabricating a semiconductor device comprising different types of transistors with individually tuned channel thicknesses.

Additional advantages and other aspects and features of the present invention will be set forth in the description which follows and in part will become apparent to those having ordinary skill in the art upon examination of the following or may be learned from the practice of the present invention. The advantages of the present invention may be realized and obtained as particularly pointed out in the appended claims.

According to the present invention, the foregoing and other advantages are obtained in part by a method of manufacturing a semiconductor device, the method comprising: forming a plurality of isolation regions in a semiconductor layer to define active regions; exposing a particular active region; conducting selective epitaxial growth to selectively increase the thickness of the semiconductor layer in the particular active region; forming a gate dielectric layer on the active regions; and forming a gate electrode on the gate dielectric layer in the active regions.

Embodiments include forming a plurality of trench isolation regions in the semiconductor layer of an SOI substrate, wherein the semiconductor layer comprises Si. After forming the shallow trench isolation regions which define a plurality of active regions, one or more active regions are selected for tailoring the channel thickness of the transistor to be formed therein, e.g., a P-MOS, N-MOS, a wide transistor or a narrow transistor, partially depleted transistor or a fully depleted transistor. After a particular active region is selected, the nitride stop layer and pad oxide layer are removed exposing the underlying semiconductor layer in the particular active region. Selective epitaxial growth is then implemented to selectively increase the thickness of the exposed underlying semiconductor layer in the particular active region. Subsequently, the nitride stop layers and pad oxide layers are removed in the other active regions, thermal oxidation is conducted to form gate oxide layers and gate electrodes are formed on the gate oxide layers. The transistors are completed by implementing ion implantation in a conventional manner.

In other embodiments of the present invention, the semiconductor layer of the SOI substrate comprises Si—Ge. In these embodiments, a protective layer of silicon is deposited after selective epitaxial growth, as by thermal chemical vapor deposition (CVD). The deposited layer of Si protects the epitaxially grown layer during acid treatment to remove the nitride stop layer.

Additional advantages and aspects of the present invention will become readily apparent to those skilled in the art from the following detailed description, wherein embodiments of the present invention are shown and described, simply by way of illustration of the best mode contemplated for practicing the present invention. As will be described, the present invention is capable of other and different embodiments, and its several details are susceptible of modification in various obvious respects, all without departing from the spirit of the present invention. Accordingly, the drawings and description are to be regarded as illustrative in nature, and not as limitative.

BRIEF DESCRIPTION OF THE DRAWINGS

In FIGS. 1 through 10, similar features or elements are denoted by similar reference characters.

DESCRIPTION OF THE INVENTION

Figure 1:
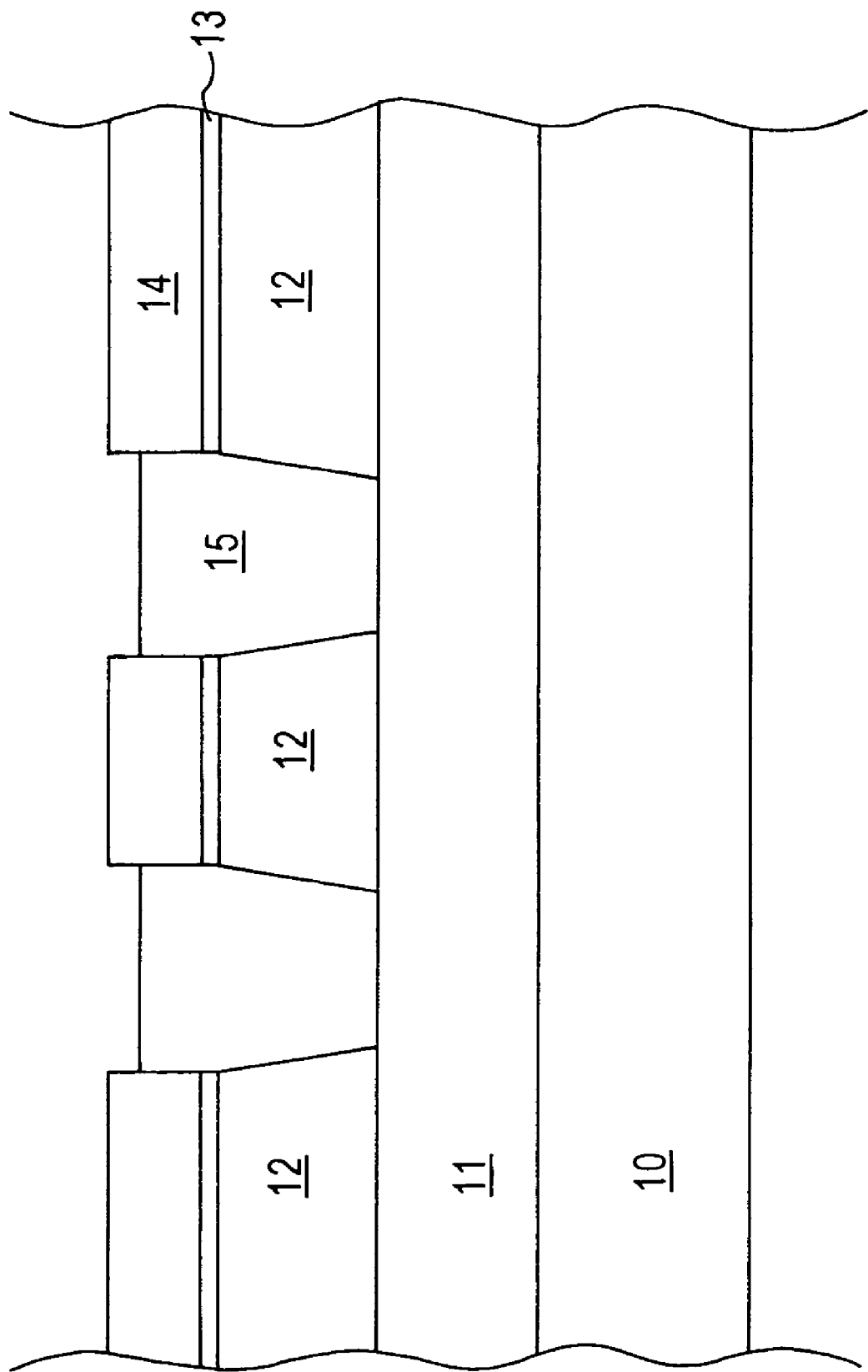
FIGS. 1 through 6 schematically illustrate sequential phases of a method in accordance with an embodiment of the present invention.

The present invention addresses and solves the problem of optimizing the performance characteristics of a semiconductor device comprising different types of transistors for a particular implementation. Semiconductor devices typically comprise various different types of transistors designed to perform certain functions. The present invention provides efficient methodology enabling the transistors to be selectively tuned with a desired channel thickness depending on its desired characteristics for the particular implementation. In this way the overall operating speed of the device is increased with improved accuracy and precision in an efficient, cost effective manner.

In accordance with embodiments of the present invention, designated active regions wherein transistors are to be formed which desirably have a thicker channel than other transistors are subjected to selective epitaxial growth in order to increase the channel thickness vis-à-vis the channels of other transistors. Such selectivity may be based upon, for example, whether the transistor is to be fully depleted or partially depleted, as when forming a plurality of transistors on an SOI substrate.

An embodiment of the present invention is schematically illustrated in FIGS. 1 through 6. Adverting to FIG. 1, a conventional SOI substrate is formed with a semiconductor layer 12, such as Si, on an insulating layer 11, such as silicon oxide, formed over a substrate 10, such as silicon. As in conventional shallow trench isolation (STI) procedures, a pad oxide 13 is formed on semiconductor layer 12, a nitride polish stop layer 14 is formed on pad oxide layer 13, a mask (not shown) is formed exposing areas in which trench isolation regions are to be formed. Anisotropic etching is then conducted to form an opening through nitride stop layer 14 and pad oxide 13. Anisotropic etching is then continued to form a plurality of trenches in semiconductor layer 12 reaching insulating layer 11. Subsequently, the trenches are filled in with a dielectric material, such as silicon dioxide by chemical vapor deposition. Typically a thermal oxide liner is formed lining the trench prior to trench filling with silicon dioxide. Planarization is then implemented, as by chemical-mechanical polishing (CMP), resulting in the structure illustrated in FIG. 1 comprising a plurality of trench isolation regions 15.

Figure 2:
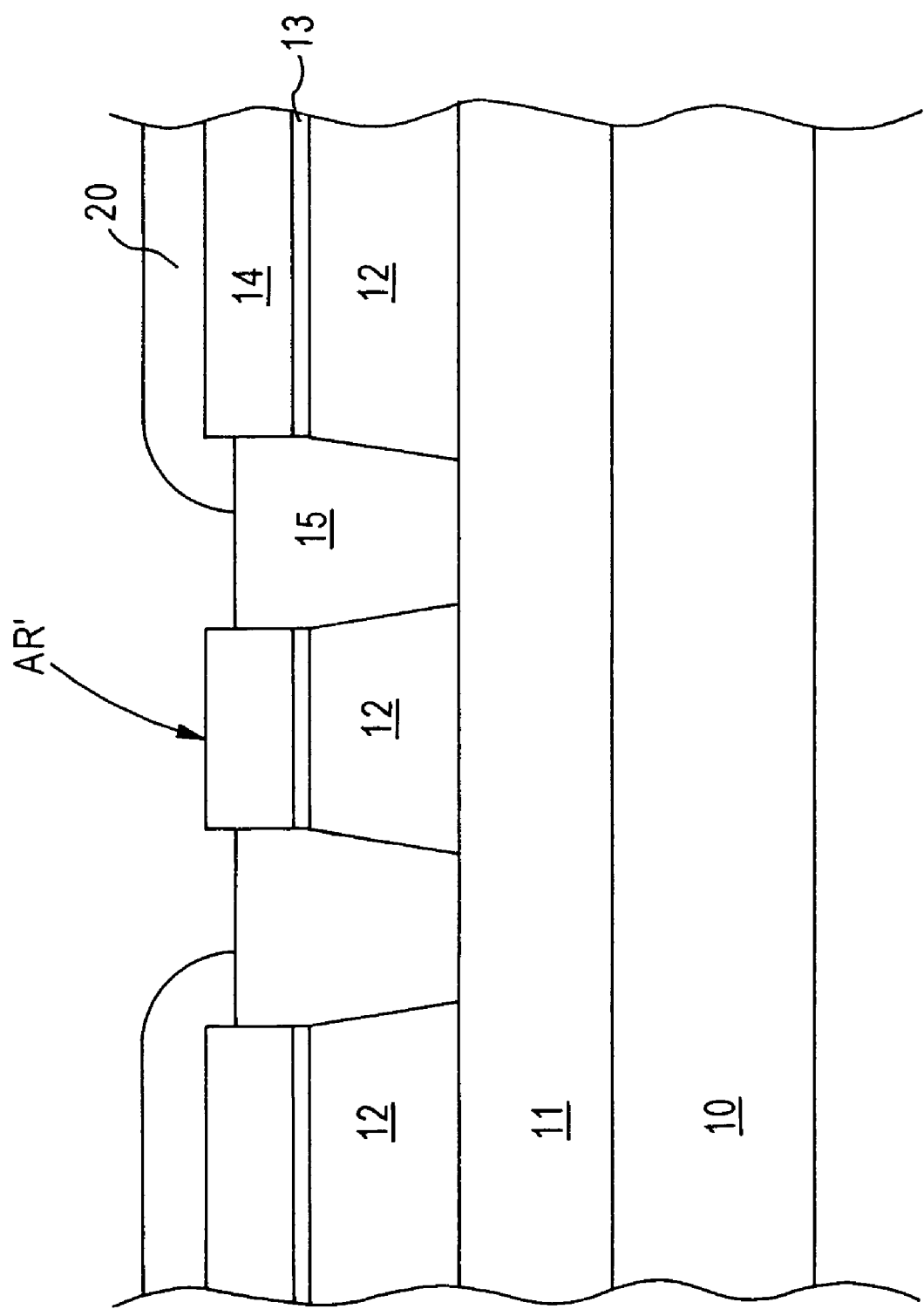

One or more particular active regions AR[1], as illustrated in FIG. 2, are selected and a mask 20, such as a photoresist mask or a hard mask, is formed over the neighboring trench isolation regions 15 and over the other active regions, as shown in FIG. 2. Etching is then conducted to remove the nitride stop layer 14 and pad oxide layer 13 in the particular active region AR[1]. The nitride stop layer 14 and pad oxide layer 13 in the designated active region AR[1] may be removed in a conventional manner. For example, the nitride stop layer may be removed by employing hot phosphoric acid, and the pad oxide layer 13 may be removed using a conventional hydrofluoric acid etch. In removing nitride stop layer 14, an etchant highly selective to oxide may be advantageously used, such as $CH_3F$ and $O_2$ or $CH_2F_2$ and $O_2$. A photo resist mask cannot typically be used when the nitride stop layer 14 is removed with hot phosphoric acid in region AR[1], owing to the poor etch resistance of photoresist to this chemical. In that case, a plasma etch process using $CH_3F/O_2$ or $CH_2F_2/O_2$ may be employed instead. A hardmask of PECVD $SiO_2$ (for example) can be used when hot phosphoric acid is used for the nitride etch. The PECVD $SiO_2$ hardmask is of lower density and quality and can easily be removed in subsequent steps using a dilute HF dip, without significant erosion of the field oxide by HF.

Figure 3:
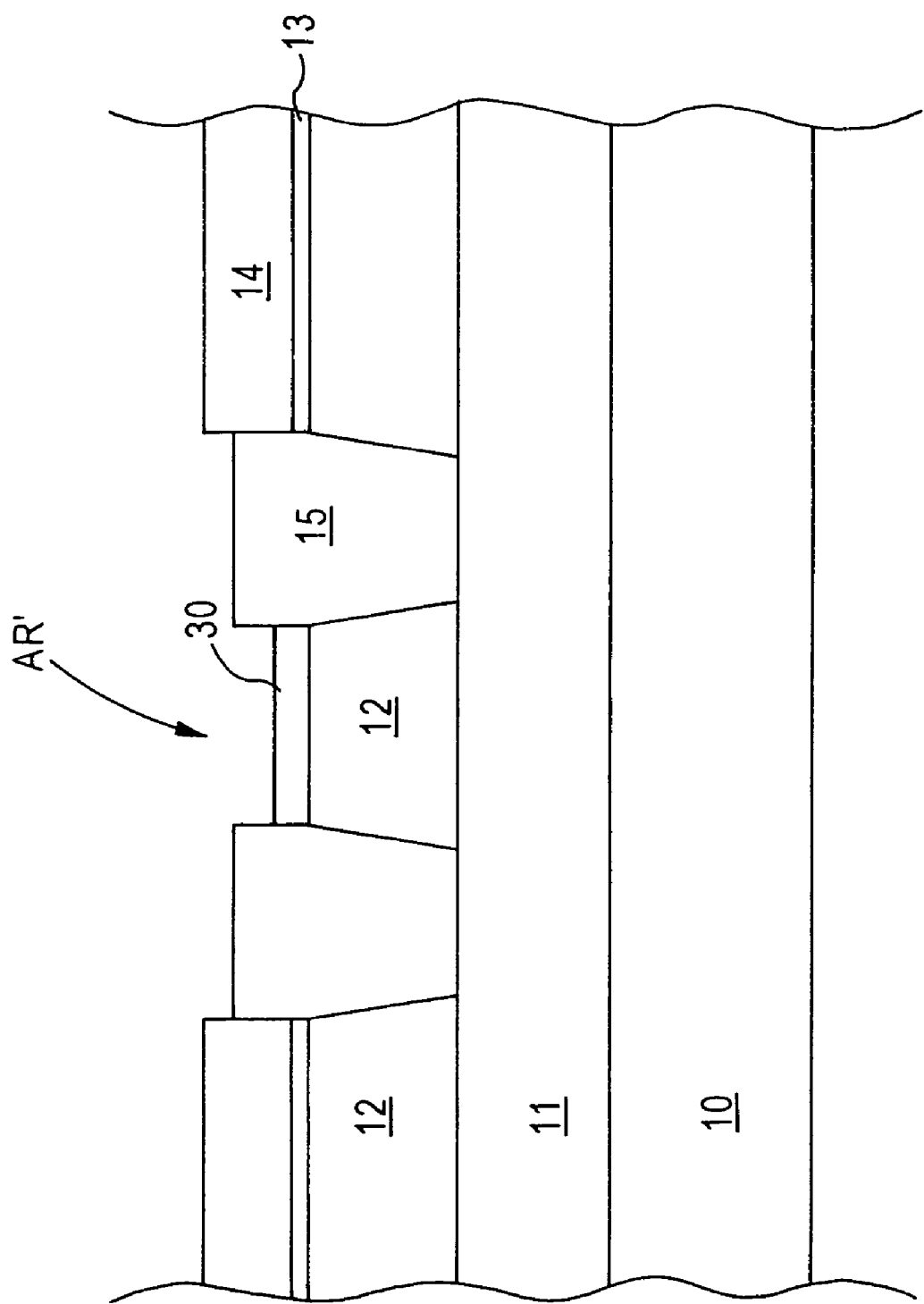

Subsequently, mask 20 is removed and selective epitaxial growth is implemented in the selected active region AR[1] to form epitaxial layer 30, as shown in FIG. 3. Epitaxial layer 30 is typically formed at a thickness of about 100 Å to about 300 Å. Layer 12 is typically at a thickness of about 200 Å to about 700 Å. Thus, the transistor to be formed in the particular active region AR[1] has a channel thickness which is increased by the thickness of epitaxial layer 30.

Figure 4:
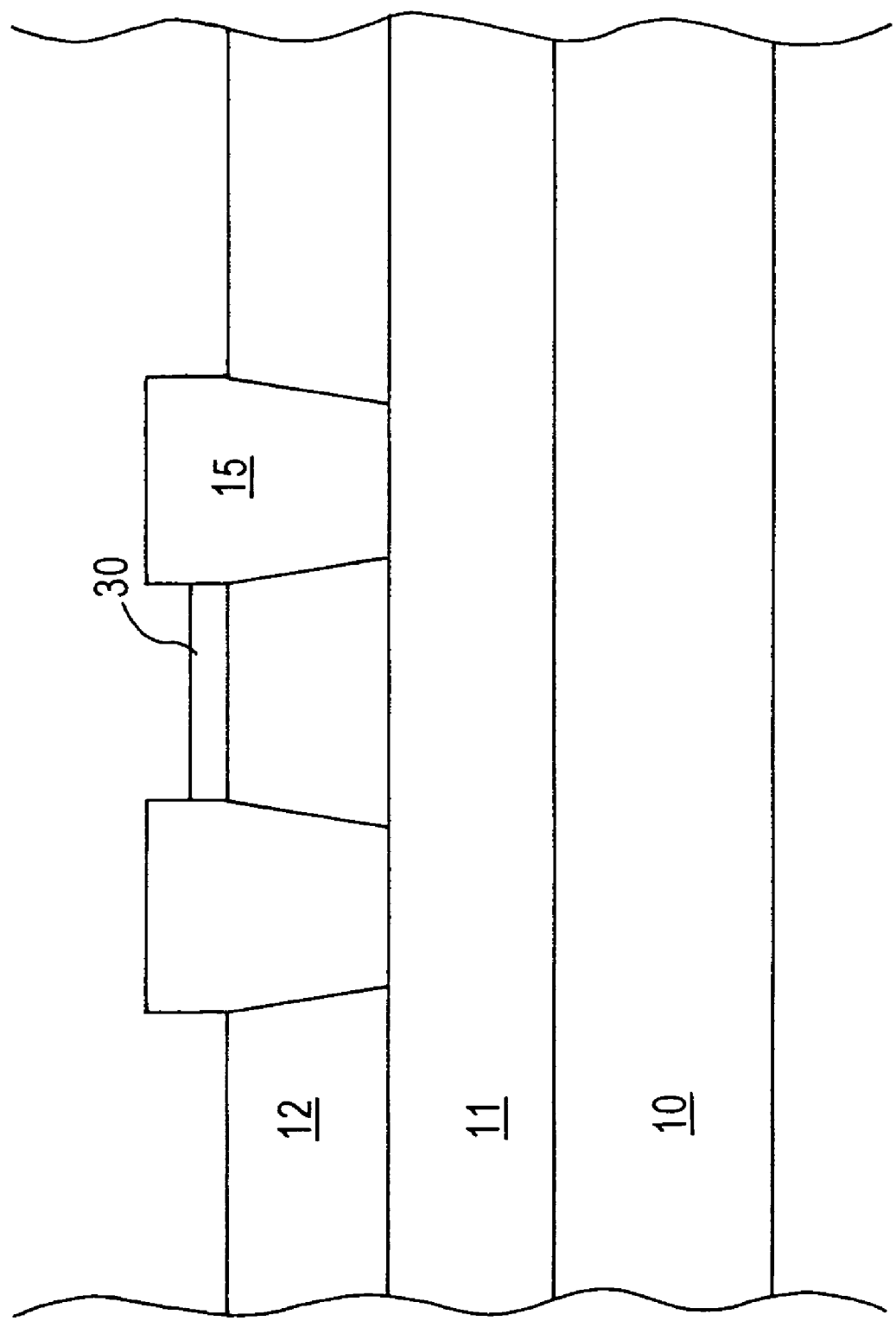

Adverting to FIG. 4, the nitride stop layers 14 and pad oxide layers 13 are then removed from the other active regions. The resulting structure is shown in FIG. 4.

Figure 5:
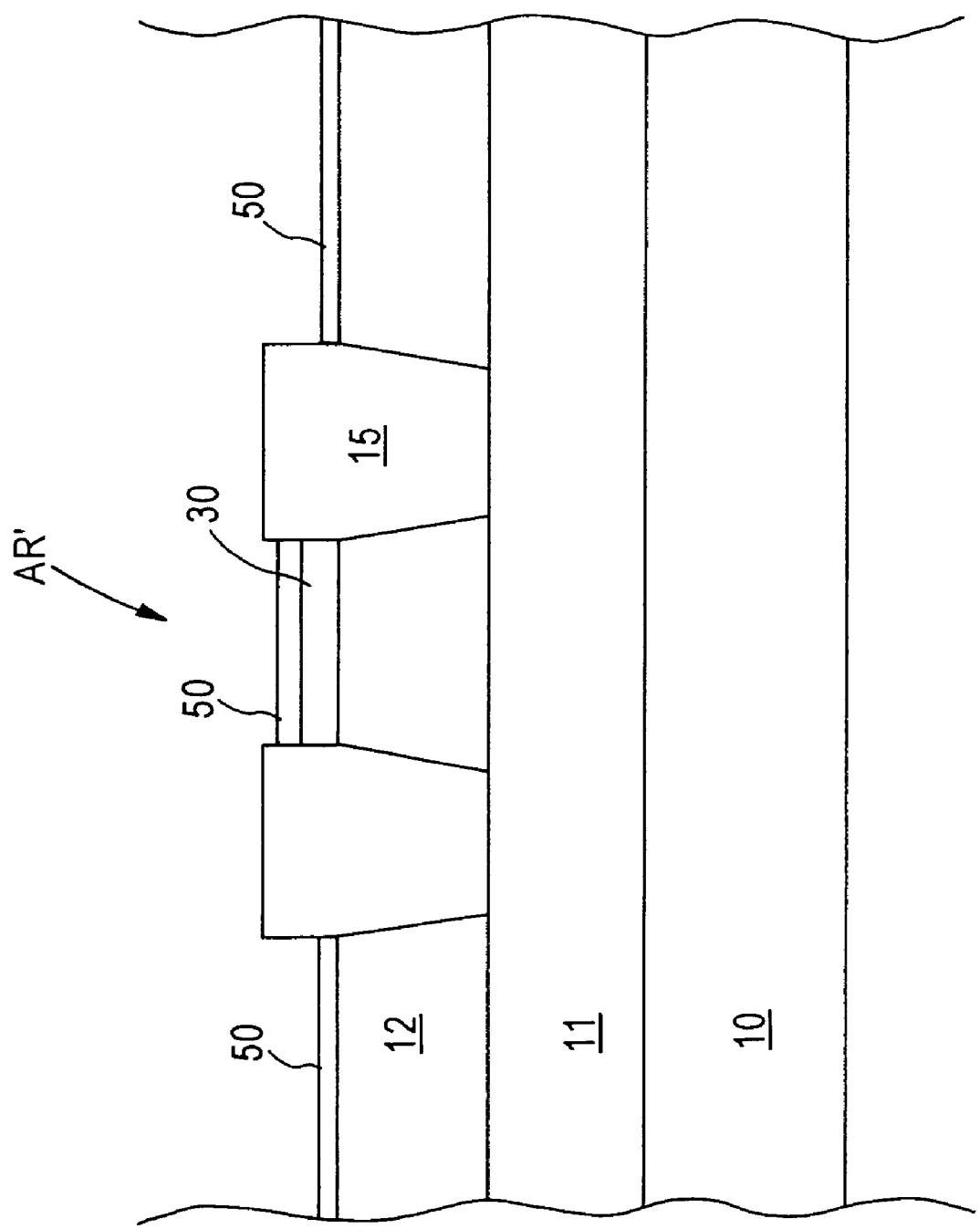
Figure 6:
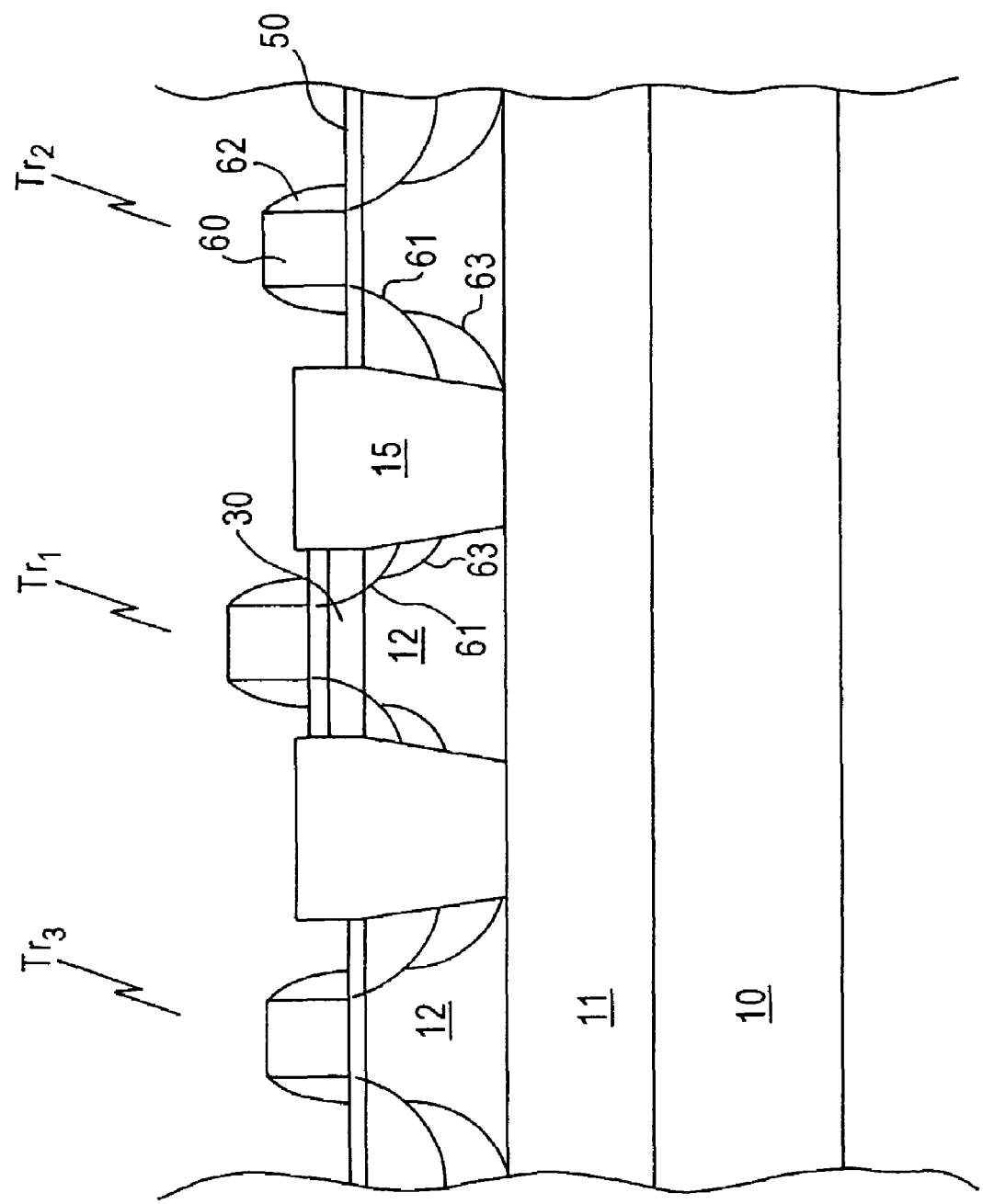

Subsequently, thermal oxidation is implemented, as shown in FIG. 5, forming gate oxide layers 50 in the active regions on the semiconductor layer 12, including on the epitaxial layer 30 in the designated active region $AR^1$. Subsequent processing is then implemented in a conventional manner, as shown in FIG. 6, to form a plurality of transistors, $Tr_1$, $Tr_2$ and $Tr_3$, wherein transistor $Tr_1$ is formed in the particular active region $AR^1$ with the increased channel thickness. In FIG. 6, reference character 61 denotes shallow source/drain extensions while reference numeral 63 denotes deep source/drain regions. Shallow source/drain extension 61 are typically formed by ion implanting using gate electrode 60 as a mask, and deep source/drain region 63 are typically formed after dielectric sidewall spacers 62 are formed on side surfaces of gate electrode 60. The increased channel thickness of $Tr_1$ by virtue of epitaxial layer 30 enables tailoring the characteristics of $Tr_1$ vis-à-vis $Tr_2$ and $Tr_3$. As shown, $Tr_1$ may be partially depleted while transistors $Tr_2$ and $Tr_3$ are fully depleted.

Figure 7:
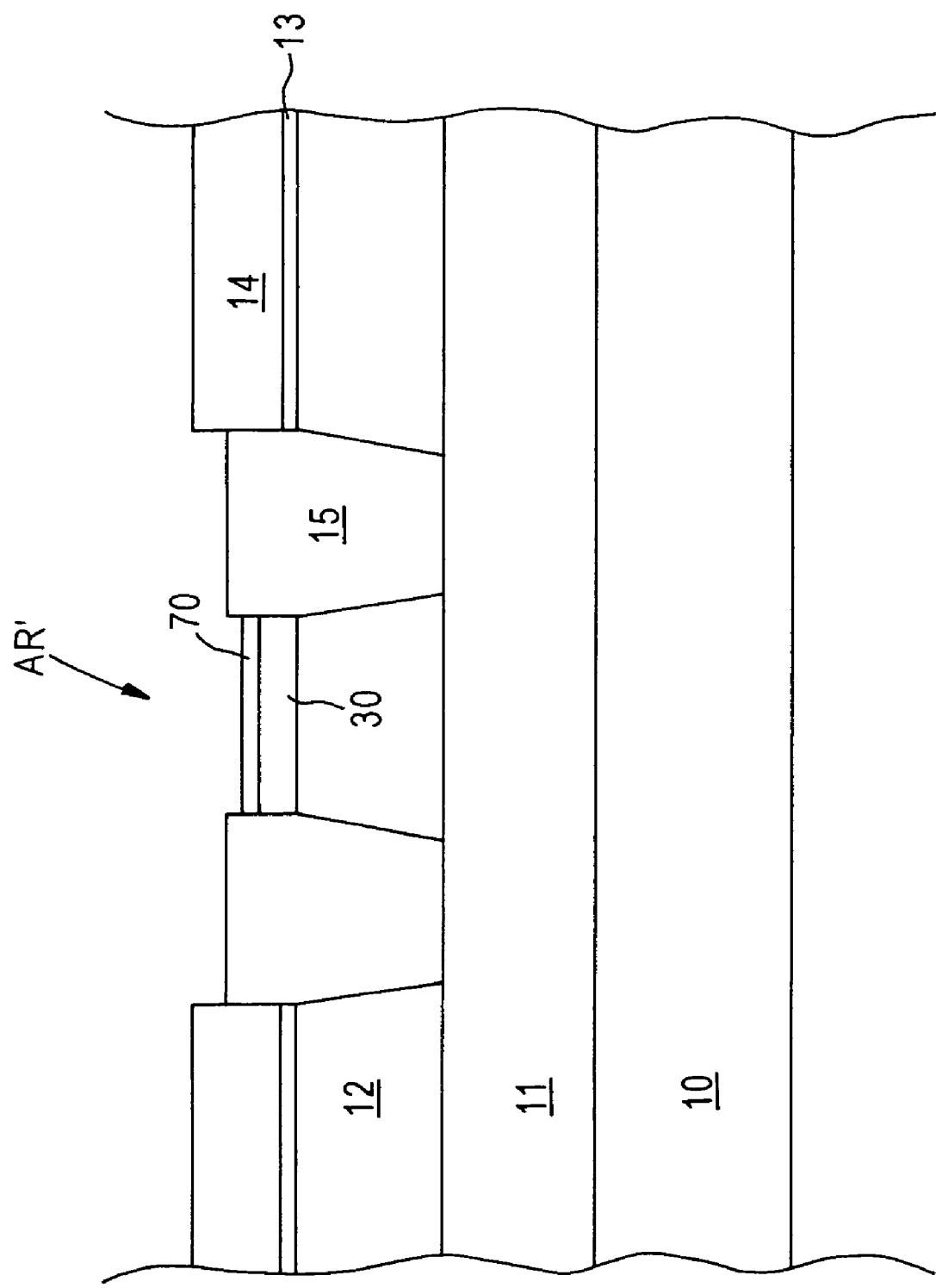
FIGS. 7 through 10 illustrate sequential phases of a method in accordance with another embodiment of the present invention.

In another embodiment of the present invention, the semiconductor layer comprises Si—Ge. In such embodiments, processing is initially implemented as shown in FIGS. 1 through 3. Subsequently, as shown in FIG. 7, a protective Si layer 70 is formed on epitaxial layer 30 to protect epitaxial layer 30 during subsequent acid treatment to remove nitride stop layers 14 and pad oxide layers 13.

Figure 8:
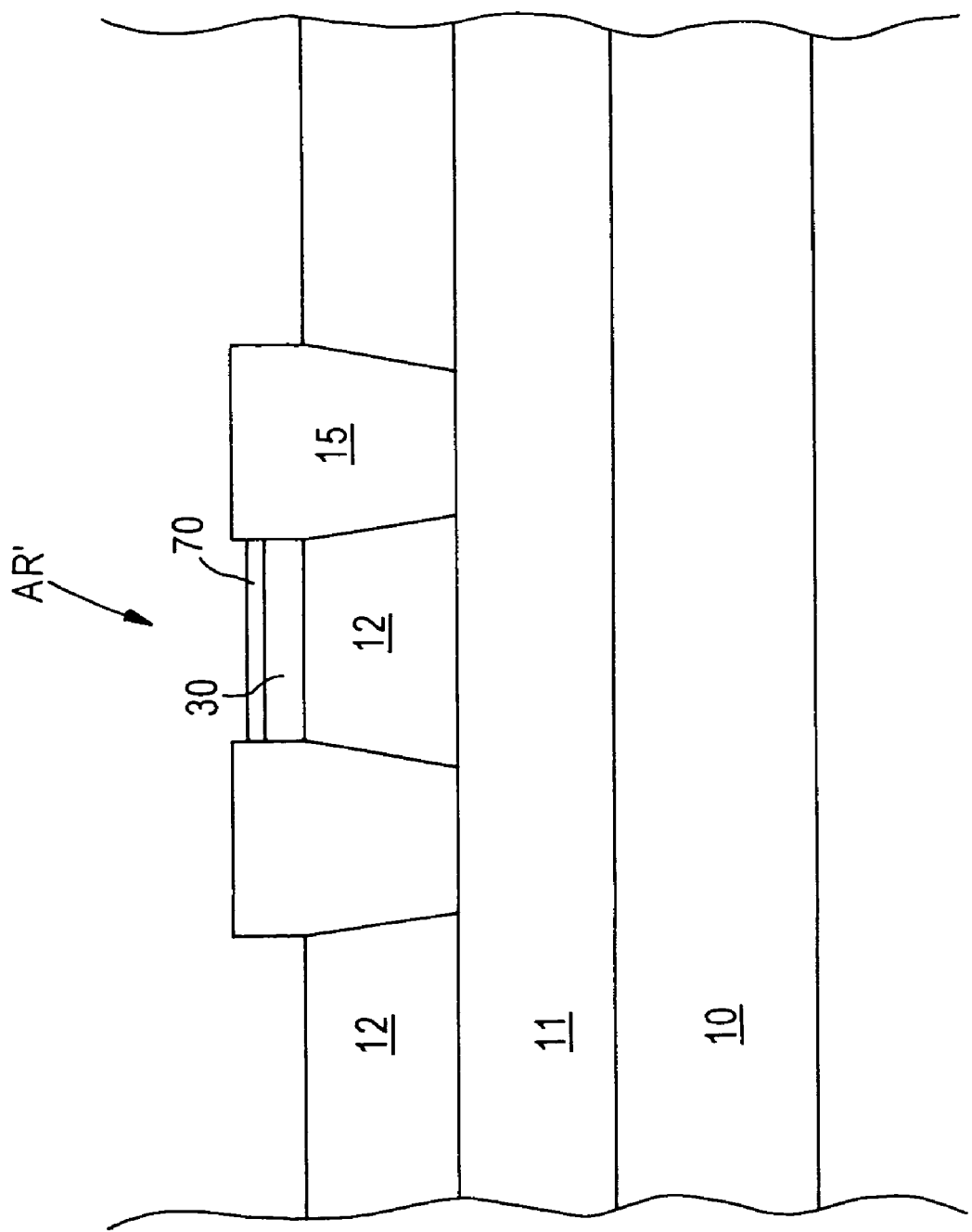
Figure 9:
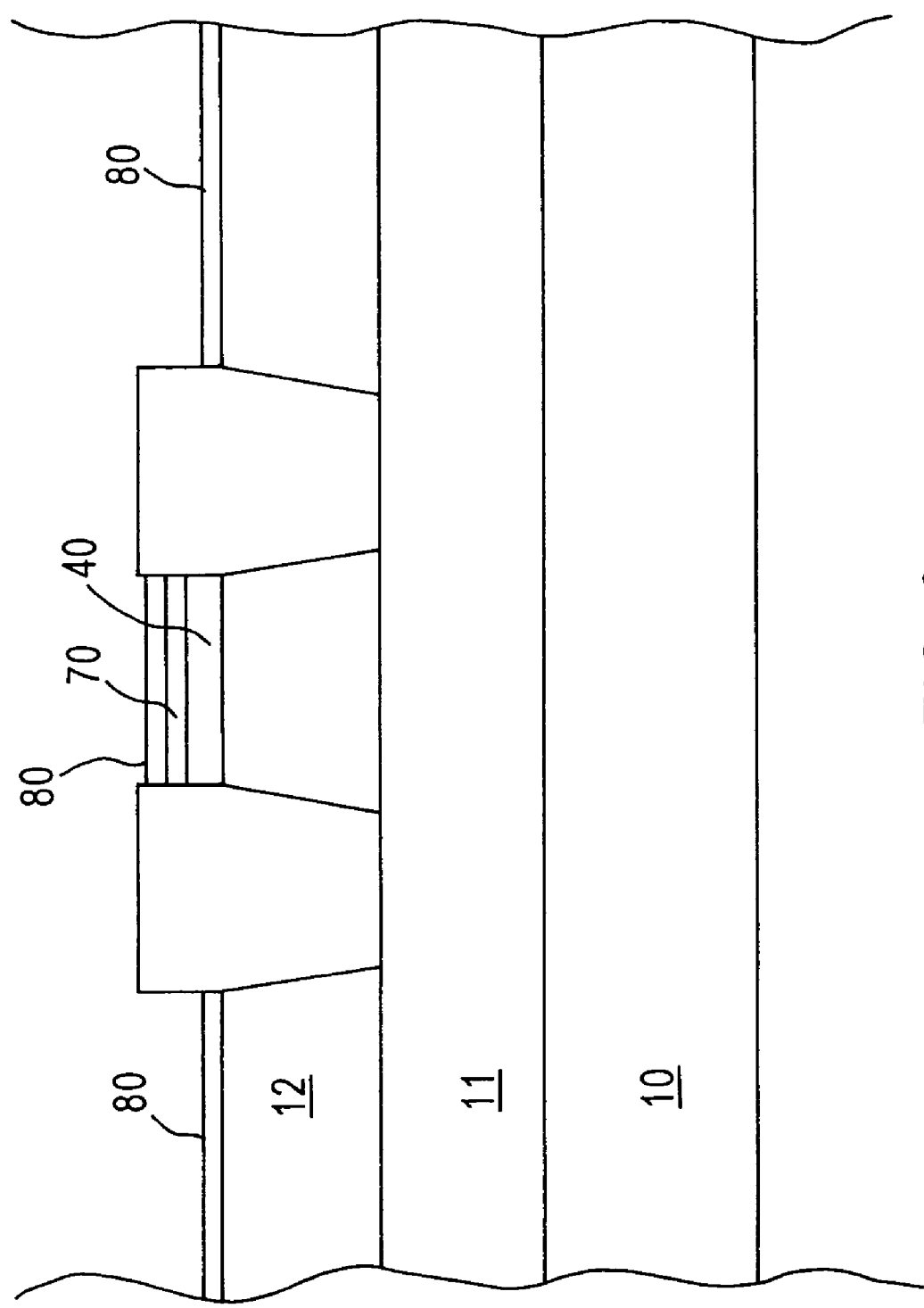
Figure 10:
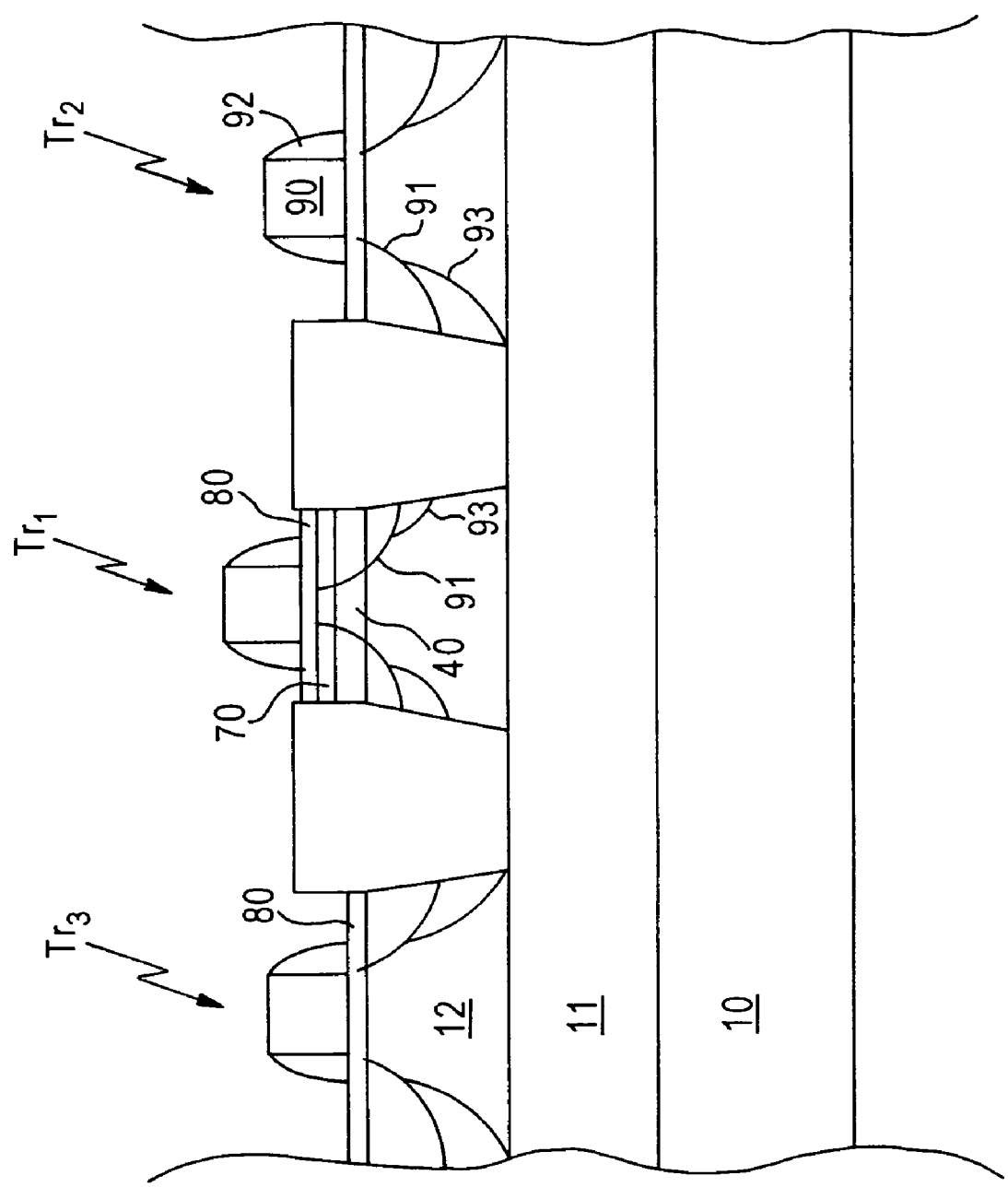

As illustrated in FIG. 8, etching is then conducted, as by employing hot phosphoric acid, to remove nitride stop layer 14. Subsequently, pad oxide layers 13 are removed, typically by employing a hydrofluoric acid solution. The resulting structure is shown in FIG. 8. Subsequent processing includes thermal oxidation to form a gate oxide layers 80, as shown in FIG. 9, and formation of a plurality of transistors $Tr_1$, $Tr_2$ and $Tr_3$, with transistor $Tr_1$ formed in the previously designated active region $AR^1$ wherein the thickness of the channel region was increased with epitaxial layer 30 and may include a portion of silicon layer 70, which was not oxidized as illustrated in FIG. 10. The transistors are formed in a conventional manner, as by forming a gate electrode 90, ion implanting to form shallow source/drain extensions 91, forming dielectric sidewall spacers 92 on the side surfaces of gate electrode 90, and ion implanting to form deep source/drain regions 93. As in the embodiment shown in FIG. 6, transistor $Tr_1$ is partially depleted, while transistors $Tr_2$ and $Tr_3$ are fully depleted.

In accordance with embodiments of the present invention, selective epitaxial growth is implemented in a conventional manner on a single crystal material, such as Si or Si—Ge. For example, in implementing selective epitaxial growth on a single crystal Si material, a silicon source with halide atoms, such as a silicon source, e.g., dichlorosilane, and hydrochloric acid (HCl). Typically the substrate is heated to an elevated temperature, such as 600° C. to 750° C. The halide atoms enhance surface mobility of the silicon atoms in the silicon source facilitating migration to sites on the material where nucleation is favored.

The present invention provides efficient, cost effective methodology enabling the fabrication of semiconductor devices having different types of transistors with individually tuned channel thicknesses. The present invention enjoys industrial applicability in fabricating various types of semiconductor devices, including semiconductor devices based on SOI substrates with shallow trench isolation regions. The present invention enables the fabrication of transistors which are both fully depleted and partially depleted in a single device. The present invention enjoys particular industrial applicability in fabricating miniaturized semiconductor devices with high operating speeds.

In the previous description, numerous specific details are set forth, such as specific materials, structures, reactants, processes, etc., in order to provide a better understanding of the present invention. However, the present invention can be practiced without resorting to the details specifically set forth. In other instances, will-known processing materials and techniques have not been described in detail in order not to unnecessarily obscure the present invention.

Only the preferred embodiment of the present invention and but a few examples of its versatility are shown and described in the present disclosure. It is to be understood that the present invention is capable of use in various other combinations and environments and is susceptible of changes or modifications within the scope of the inventive concept as expressed herein.

What is claimed is:

1. A method of fabricating a semiconductor device, the method comprising:
    forming a plurality of isolation regions in a semiconductor layer to define active regions;
    exposing a particular active region;
    conducting selective epitaxial growth to selectively increase the thickness of the semiconductor layer thereby increasing the thickness of a channel region of a transistor formed in the particular active region;
    forming a gate dielectric layer on the active regions after conducting selective epitaxial growth; and
    forming a gate electrode on the gate dielectric layer in the active regions.

2. The method according to claim 1, comprising:
    forming the semiconductor layer on a dielectric layer over a substrate; and
    forming shallow trench isolation regions as the plurality of isolation regions.

3. The method according to claim 2, comprising forming the shallow trench isolation regions by sequentially:
    forming a pad oxide layer on the semiconductor layer;
    forming a nitride polish stop layer on the pad oxide layer;
    etching a plurality of openings in the semiconductor layer;
    filling the openings with dielectric material; and
    conducting chemical-mechanical polishing (CMP) stopping on the nitride polish stop layer over the active regions.

4. The method according to claim 3, comprising forming the gate dielectric layer by thermal oxidation.

5. The method according to claim 1, comprising:
    forming the semiconductor layer on a dielectric layer over a substrate; and
    forming shallow trench isolation regions as the plurality of isolation regions.

6. The method according to claim 1, wherein the semiconductor layer comprises silicon-germanium.

7. A method of fabricating a semiconductor device, the method comprising:
    forming a plurality of isolation regions in a semiconductor layer to define active regions; by sequentially:
        forming a pad oxide layer on the semiconductor layer;
        forming a nitride polish stop layer on the pad oxide layer;
        etching a plurality of openings in the semiconductor layer;
        filling the openings with dielectric material; and conducting chemical-mechanical polishing (CMP) stopping on the nitride polish stop layer over the active regions;

forming a mask on the nitride stop layer and shallow trench isolation regions exposing a particular active region;

removing the nitride polish stop layer and pad oxide layer on the particular active region exposing the underlying semiconductor layer; and conducting selective epitaxial growth to selectively increase the thickness of the exposed underlying semiconductor layer in the particular active region;

then forming a gate dielectric layer on the active regions; and forming a gate electrode on the gate dielectric layer in the active regions.

8. The method according to claim 7, comprising conducting selective epitaxial growth to increase the thickness of the semiconductor layer by about 100 Å to about 300 Å.

9. The method according to claim 7, comprising:
removing the nitride stop layer and pad oxide layers over the active regions after conducting selective epitaxial growth; and
thermally oxidizing the semiconductor layer to form a gate oxide layer as the gate dielectric layer on the active regions.

10. The method according to claim 9, wherein the semiconductor layer comprises a layer of silicon.

11. The method according to claim 7, comprising:
forming a gate electrode on the gate dielectric layer in the active regions; and
forming a plurality of transistors, each comprising one of the gate electrodes.

12. The method according to claim 7, wherein the semiconductor layer comprises a layer of silicon-germanium.

13. The method according to claim 12, comprising depositing a layer of silicon on the exposed underlying semiconductor layer in the particular active region after increasing the thickness of the semiconductor layer by selective epitaxial growth; and
removing the remaining nitride stop layer and pad oxide layer over the active regions after depositing the layer of silicon.

14. The method according to claim 13, comprising depositing the layer of silicon by chemical vapor deposition.

15. The method according to claim 14, comprising depositing the layer of silicon at a thickness of about 50 Å to about 100 Å.

16. The method according to claim 13, comprising thermally oxidizing the semiconductor layer to form a gate oxide layer as the gate dielectric layer in the active regions.

17. A method of fabricating a semiconductor device, the method comprising:
forming a plurality of isolation regions in a semiconductor layer to define active regions;
exposing a particular active region while leaving one or more other active regions unexposed;
conducting selective epitaxial growth to selectively increase the thickness of the semiconductor layer in the particular active region;
then forming a gate dielectric layer on the active regions; and
forming a gate electrode on the gate dielectric layer in the active regions.

18. A method of fabricating a semiconductor device, the method comprising:
forming a silicon-on-insulator (SOI) substrate comprising a semiconductor layer on an insulating substrate or over an insulating layer formed on a substrate;
forming a plurality of isolation regions in the semiconductor layer to define active regions;
exposing a particular active region;
conducting selective epitaxial growth to selectively increase the thickness of the semiconductor layer in the particular active region;
the forming a gate dielectric layer on the active regions; and
forming a gate electrode on the gate dielectric layer in the active regions.

19. The method according to claim 18, comprising:
forming the semiconductor layer on an insulating layer over a substrate; and
forming shallow trench isolation regions as the plurality of isolation regions.

* * * * *

UNITED STATES PATENT AND TRADEMARK OFFICE
CERTIFICATE OF CORRECTION

PATENT NO.         : 7,105,399 B1
APPLICATION NO. : 11/004951
DATED              : September 12, 2006
INVENTOR(S)        : Srikanteswara Dakshina-murthy et al.

It is certified that error appears in the above-identified patent and that said Letters Patent is hereby corrected as shown below:

Under "What is claimed is:",

Column 7, line 21, change "layers" to -- layer --

Column 8, line 33, before the word "forming", delete the word "the"

Signed and Sealed this

Fifteenth Day of May, 2007

JON W. DUDAS
*Director of the United States Patent and Trademark Office*